United States Patent [19]
Andoh et al.

[11] Patent Number: 5,936,466
[45] Date of Patent: Aug. 10, 1999

[54] DIFFERENTIAL OPERATIONAL TRANSCONDUCTANCE AMPLIFIER

[75] Inventors: Hajime Andoh, Shiga, Japan; Denny Duan Lee Tang, Saratoga, Calif.

[73] Assignee: International Business Machines Corporation, Armonk, N.Y.

[21] Appl. No.: 08/905,748

[22] Filed: Aug. 4, 1997

[51] Int. Cl.[6] .............................. H03F 3/45; G06F 7/44
[52] U.S. Cl. ........................................ 330/253; 327/359
[58] Field of Search ................................. 330/253, 258, 330/254, 284; 327/359

[56] References Cited

U.S. PATENT DOCUMENTS

| | | | |
|---|---|---|---|
| 4,667,165 | 5/1987 | De Weck | 330/253 |
| 4,771,196 | 9/1988 | Mead et al. | 307/605 |
| 4,881,043 | 11/1989 | Jason | 330/352 |
| 4,935,703 | 6/1990 | Poletto | 330/255 |
| 5,001,441 | 3/1991 | Gen-Kuong | 330/294 |
| 5,113,092 | 5/1992 | Herold | 307/356 |
| 5,363,059 | 11/1994 | Thiel | 330/253 |
| 5,392,003 | 2/1995 | Nag et al. | 330/254 |
| 5,463,348 | 10/1995 | Sarpeshkar et al. | 330/253 |
| 5,491,447 | 2/1996 | Goetschel et al. | 330/254 |
| 5,703,532 | 12/1997 | Shin et al. | 330/253 |

OTHER PUBLICATIONS

B.l Nauta, "A CMOS Transconductance–C Filter Technique for very High Frequencies", IEEE Journal of Solid–State Circuits, vol. 27, No. 2, Feb. 1992.

A. N. Karanicolas, "TP 3.2: A 2.7V 900MHz CMOS LNA and Mixer", 1996 IEEE International Solid–State Circuits Conference, Digest of Technical Papers.

*Primary Examiner*—Robert Pascal
*Assistant Examiner*—Patricia Nguyen
*Attorney, Agent, or Firm*—Khanh Q. Tran

[57] ABSTRACT

A low-power dual-$g_m$ differential operational transconductance amplifier (OTA) having a differential input for improved common-mode noise rejection, a high transconductance for power savings, and circuitry for controlling its output conductance. The OTA includes a pair of input inverters for receiving differential input signals, a common-mode voltage control circuit for controlling the DC voltage levels of the inverters, and a Q-control circuit for adjusting the OTA's output conductance. The common-mode voltage control circuit has a pair of compensating current sources and a feedback loop acting as a high-gain amplifier. The high-gain amplifier has a pair of comparators for respectively comparing the DC voltage levels of the inverter outputs with a reference voltage. The Q-control circuit includes a current source coupled to a crossed-coupled NMOS transistor pair such that the OTA's output conductance may be controlled by adjusting the current source.

16 Claims, 9 Drawing Sheets

5,936,466

DIFFERENTIAL OPERATIONAL TRANSCONDUCTANCE AMPLIFIER

FIELD OF THE INVENTION

The present invention relates to operational transconductance amplifiers (OTAs), and more particularly, to an OTA that accepts a differential input and has a high transconductance for improved performance and reduced power consumption.

BACKGROUND OF THE INVENTION

Operational transconductance amplifiers are well-known electronic devices that are used in a wide variety of applications such as electronically tunable filters and analog signal processors. An ideal OTA includes a transconductance stage that converts a voltage signal into a current signal in such a manner that the amplifier presents a very high input impedance to the input signal source and a very low output impedance to the load. In addition, the ideal OTA would have a very high input-voltage-to-output-current conversion factor, which is referred to as its transconductance. FIG. 1 shows a conventional OTA implemented in the CMOS (Complementary Metal-Oxide Semiconductor) technology. An NMOS transistor 1 acts as a current source to a pair of NMOS input transistors 2 and 3, whose gate terminals are coupled to a pair of differential signals $v_{in1}^+$ and $v_{in1}^-$, respectively. Variations in the input signals $v_{in1}^+$ and $v_{in1}^-$ induce changes in the respective drain currents $I_1$ and $I_2$ of the transistors 2 and 3. The amount of current difference between the input transistors 2 and 3 is given by $I_1-I_2=g_{m1}*(v_{in1}^+-v_{in1}^-)$, where $g_{m1}$ is the transconductance for each of the NMOS transistors 2 and 3.

Two PMOS transistors 4 and 5 provide an equal amount of current to each of the NMOS transistors 2 and 3. Optionally, the OTA may include another pair of differential NMOS transistors (not shown) similar to the NMOS transistors 2 and 3, for receiving an additional differential input. A second current source would also be needed to drive the second NMOS transistor pair. The drain terminals of the second NMOS transistors would be connected to those of the NMOS transistors 2 and 3, respectively. The gate terminals of the additional NMOS transistors would receive a second pair of differential input signals, e.g., $v_{in2}^+$ and $v_{in2}^-$, respectively. The output terminals 6 and 7 of the OTA behave as a pair of differential current sources that draw current in and out of the OTA. The differential current at the output of the OTA is the same as the current difference between the input transistors 2 and 3 given above, which is $g_{m1}*(v_{in1}^+-v_{in1}^-)$, where $g_{m1}$ represents the transconductance for each of the differential NMOS transistors 2 and 3.

A feedback circuit 13 on the right side of FIG. 1 controls the common-mode voltage of the OTA's outputs 6 and 7. The feedback circuit 13 comprises an PMOS transistor 10 with its source coupled to the OTA's supply voltage $V_{dd}$, its drain and gate coupled to the gate terminals of the PMOS transistors 4–5. An NMOS transistor 12 serves as a current source to the transistors 8–11 of the feedback circuit 13. The gate of the NMOS transistor 11 is connected to a reference voltage $V_{REF}$. A pair of NMOS transistors (8 and 9) is provided for sensing the OTA's outputs 6 and 7, with their gates connected to the OTA's output signals $v_{out}^+$ and $v_{out}^-$. The average of $v_{out}^+$ and $v_{out}^-$, is compared by the NMOS transistor 11 to a reference voltage $V_{REF}$. If this average is higher than $V_{REF}$, then the OTA's outputs 6 and 7 will be forced down until it is equal to $V_{REF}$. In other words, the common-mode voltage OTA's outputs is equal to $V_{REF}$.

FIG. 2 shows a simplified circuit diagram of the OTA of FIG. 1, in which the common-mode voltage control circuit 13 is represented as a single element 13. Next, FIG. 3 shows a common circuit symbol for differential OTAs, such as the one described above in reference to FIGS. 1 and 2. By interconnecting several such OTAs in different configurations, one can perform desired mathematical manipulations of the input signals $v_{in1}^+$ and $v_{in1}^-$. For example, a number of so-called "integrators", each consisting of an OTA and a capacitor, may be connected in series to form an electronically tunable filter that is commonly used in communication applications. An example of such a filter constructed using the differential OTA of the invention will be described in detail later in the specification, with reference to FIG. 10.

One of the problems with conventional CMOS OTAs is their high power consumption. In low-power portable applications of OTAs, especially those with high-frequency filter components, it is very desirable to have a large transconductance for the OTAs. However, for OTAs implemented in CMOS technology, the CMOS transistors making up these OTAs typically have a transconductance $g_m$ that is relatively low compared to that of bipolar transistors operating at the same DC current. Since the transconductance of a CMOS transistor is proportional to the square root of its DC current, this DC current would need to be increased four times in order to double the transconductance of the transistor. Unfortunately, this would result in a fourfold increase in the OTA's power dissipation.

Another drawback of conventional CMOS OTAs is their relatively large output conductance. Consider the prior art differential OTA of FIG. 1, an equivalent circuit of this OTA is shown by the circuit diagram of FIG. 4, with its output conductance and capacitance being represented by $g_o$ and $C_o$, respectively,. As shown by the OTA's equivalent circuit, the output conductance $g_o$ of the OTA is in shunt with its output capacitance $C_o$. This finite output conductance acts as a shunt to the output current $i_o$ and reduces the magnitude of the output AC current to be delivered to the load. As a result, the output frequency response of the OTA, and consequently its bandwidth, are significantly degraded.

In some prior art OTAs, attempts have been made to reduce their output conductance by adding a PMOS stage to limit the variation of the current source of the OTA, and thus reducing the OTAs' output conductance. FIG. 5 shows the circuit diagram of a prior art OTA with this additional transistor stage for improving the OTA's output conductance. Similar to the differential OTA of FIG. 1, this OTA includes a pair of input NMOS transistors 17 and 18 driven by a current source 19. The PMOS transistors 20 and 21 provide a common-mode control circuit, similar to the PMOS transistors 4 and 5 in FIG. 1, respectively. A second PMOS transistor stage, consisting of transistors 22 and 23, is added between the common-mode control circuit and the input transistors 17–18. Since the drain voltage of the PMOS transistors 20–21 does not swing as much as the OTA's output signals $v_{out}^+$ and $v_{out}^-$, these transistors act as a current source with a very small output conductance. A disadvantage of this solution is that the additional PMOS stage can only be used when the OTA is implemented in CMOS technology with a sufficient power supply voltage, e.g., $V_{dd}=5$ V. However, as the CMOS technology is scaled down to a smaller dimension for higher speed and larger integration, the value of $V_{dd}$ becomes lower and lower. The stacking of an additional layer of PMOS transistors in a low-$V_{dd}$ circuit is thus very undesirable, if not impossible. Accordingly, the use of a second PMOS transistor stage to reduce an OTA's output conductance is becoming less desirable in today's advanced CMOS circuits.

In the article "A 2.7 V 900 MHz CMOS LNA and Mixer," Digest of IEEE International Solid-State Circuits Conference, 1996, p. 50, A. N. Karanicolas describes a low-noise amplifier using the transconductance of its inverters. A simplified circuit diagram of this amplifier is illustrated in FIG. 6. The low-noise amplifier includes a DC-level voltage control circuit 24, an AC-coupled single-ended inverting amplifying circuit 25, and another DC-level voltage control circuit 26. As shown by FIG. 6, the DC-level voltage control circuit 26 is controlled by resistor 27 and capacitors 28–29. However, in today's highly integrated circuits, these resistor and capacitor components are undesirable because they increase the physical size and cost of the amplifier.

Another design of a CMOS transconductance amplifier is described by B. Nauta in "A CMOS Transconductance-C Filter Technique for Very High-frequencies," IEEE Journal of Solid State Circuits, V.27, No.2, p. 142, February, 1992. Here, the high-frequency amplifier is part of a differential transconductance filter using CMOS inverters. FIG. 7 shows a circuit diagram for this amplifier, in which two inverters 30 and 31 form a differential input pair for receiving the input signals $v_{in}^+$ and $v_{in}^-$. Additional pairs of inverters, e.g., the pair of inverters 32 and 33, are used to control the common-mode voltage of the OTA's output $v_{out}^+$ and $v_{out}^-$. Although the CMOS inverters 30 and 31 provide a transconductance for the amplifier, they are not a true differential pair because they do not draw current from a single current source. The described amplifier thus lacks a common-mode noise rejection capability.

Therefore, there remains a need for an OTA that accepts a differential input, has means for controlling its output conductance and a relatively large transconductance for low power consumption.

SUMMARY OF THE INVENTION

It is an object of the present invention to provide an operational transconductance amplifier (OTA) capable of receiving a differential input for better rejection of common-mode noise interference.

It is another object of the present invention to provide a differential-input OTA having input inverters with dual transconductance to provide the OTA with a relatively large transconductance.

It is a further object of the present invention to provide a differential-input OTA with means for controlling its output conductance to maximize its gain and frequency response characteristics.

It is yet another object of the invention to provide a differential-input OTA in CMOS technology to keep the OTA's power consumption to a minimum while still having excellent operating characteristics.

To achieve these and other objects, the present invention provides a dual-$g_m$ differential operational transconductance amplifier (OTA) having a pair of input inverters for receiving the positive and negative signals of a differential analog input, a common-mode voltage control circuit, and a Q-control circuit. The outputs of the two inverters are coupled respectively to the differential outputs of the OTA and supply the OTA outputs with a relatively large transconductance. The common-mode voltage control circuit is coupled to the OTA's outputs to provide a feedback loop for controlling the respective DC voltage levels in the inverter outputs. The Q-control circuit is tied to the outputs of the inverters so that the OTA's output conductance may be adjusted by simply changing the operating current flowing through the Q-control circuit, thus affecting the OTA's quality factor (Q-factor).

In the preferred embodiment of the invention, each input inverter includes a PMOS transistor and a NMOS transistor connected in series, with their gates tied to the respective differential input signals. The inverter's transconductance is therefore referred to as dual-$g_m$, i.e., its transconductance is equal to the total transconductance of the PMOS and NMOS transistors making up the inverter.

The common-mode voltage control circuit of the OTA preferably includes a pair of PMOS transistors, which act as compensating current sources, and a common-mode feedback circuit, which acts as a high-gain amplifier. The common-mode feedback circuit is connected between the input inverters and PMOS transistors for controlling the gates of the PMOS transistors. In the preferred embodiment of the invention, the feedback circuit includes a pair of comparators for respectively comparing the DC voltage levels of the inverter outputs with a predetermined reference voltage $V_{REF}$. The outputs of the comparators are connected to the corresponding compensating current sources. Each of the comparators is associated with a gain and a phase margin, and includes a pair of NMOS transistors, with the drains of the transistors connected to a bias current source. The common-mode feedback circuit further includes a cross-coupled PMOS transistor load connected to the comparators to improve their respective gains and phase margins. With such a cross-coupled arrangement, the PMOS transistors provide better sensitivity to the OTA's common-mode voltage errors, and thus a more precise control of the common-mode voltage in the OTA outputs.

The Q-control circuit preferably includes a pair of NMOS transistors whose source terminals are connected to the drain of a third NMOS transistor. This third NMOS operates as a current source to the Q-control circuit. The drain terminals of the first and second NMOS transistors are connected to the OTA's differential outputs $v_{out}^+$ and $v_{out}^-$, respectively. The gate and drain terminals of the first and second transistors are crossed-coupled with each other to improve the Q-factor of the dual-$g_m$ differential OTA. The Q-factor of an OTA is described, for instance, in U.S. Pat. No. 5,001,441, issued to F. Gen-Kuong. In addition, the gate terminal of the third NMOS transistor (the current source) is connected to a control signal $V_{Q\text{-}Control}$. By varying the value of the $V_{Q\text{-}Control}$ signal, the current from the current source may be adjusted to maximize the output conductance of the OTA, and subsequently, its gain and frequency response.

In a typical application of the dual-$g_m$ differential OTA of the invention, many such OTAs might be connected in different configurations to perform desired mathematical manipulations of the input signals. As an example, an electronically tunable $g_m$C filter can be constructed using the dual-$g_m$ differential OTA of the invention as a building block. This tunable $g_m$C filter will be described in detail later in the specification.

Additional objects and advantages of the present invention will be set forth in the description which follows, and in part will be obvious from the description and the accompanying drawing, or may be learned from the practice of this inventi

DESCRIPTION OF THE PREFERRED EMBODIMENT

Figure 8:
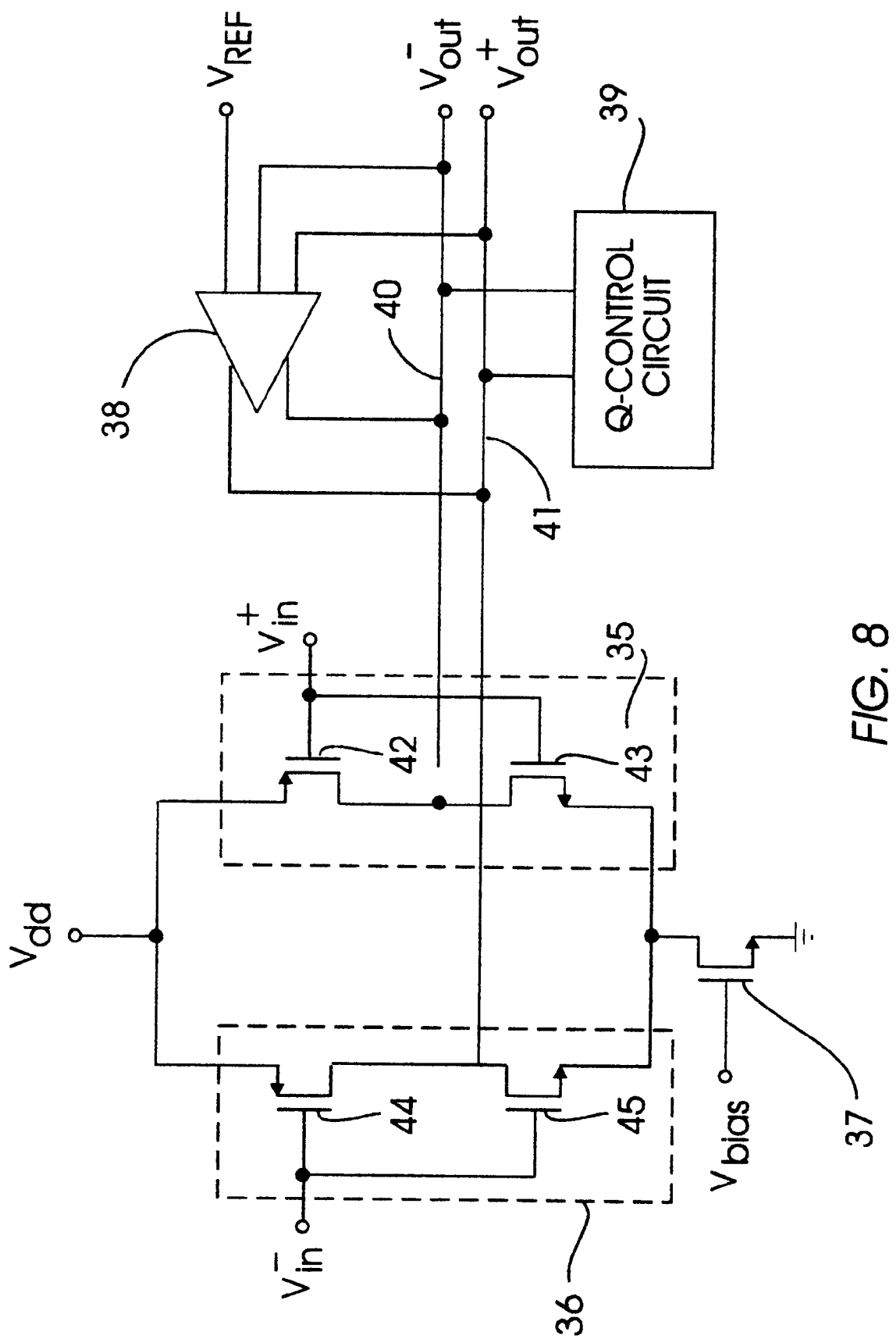
FIG. 8 shows a simplified circuit diagram of the dual-$g_m$ differential OTA in accordance with the invention.

FIG. 8 shows a simplified schematic block diagram of the dual-$g_m$ differential input OTA in accordance with the present invention. The differential OTA of the invention comprises essentially a pair of input inverters (35 and 36), a current source 37, a common-mode voltage control circuit 38, and a Q-control circuit 39. The input inverters 35 and 36 receive, respectively, the positive Input signal $V_{in}^+$ and negative input signal $V_{in}^-$ of a differential input, and are powered by the current source 37. As an example, the current source 37 here is an NMOS transistor with its source connected to ground and Its gate connected to a bias voltage $V_{bias}$.

In the preferred embodiment of the invention, the inverter 35 includes an PMOS transistor 42 and an NMOS transistor 43 connected in series, with their gates tied to the input signal $V_{in}^+$. The source terminal of the PMOS transistor 42 is coupled to a supply voltage $V_{dd}$, while the source of the NMOS transistor 43 is coupled to the current source 37. The drains of the transistors 42 and 43 are connected together to form the output of the inverter 35, which is also the negative output 40 of the OTA ($V_{out}^-$). Similarly, the inverter 36 includes a PMOS transistor 44 and an NMOS transistor 45 which are in the same arrangement as that for the transistors 42 and 43, and produces the OTA's positive output 41 ($V_{out}^+$).

Figure 1:
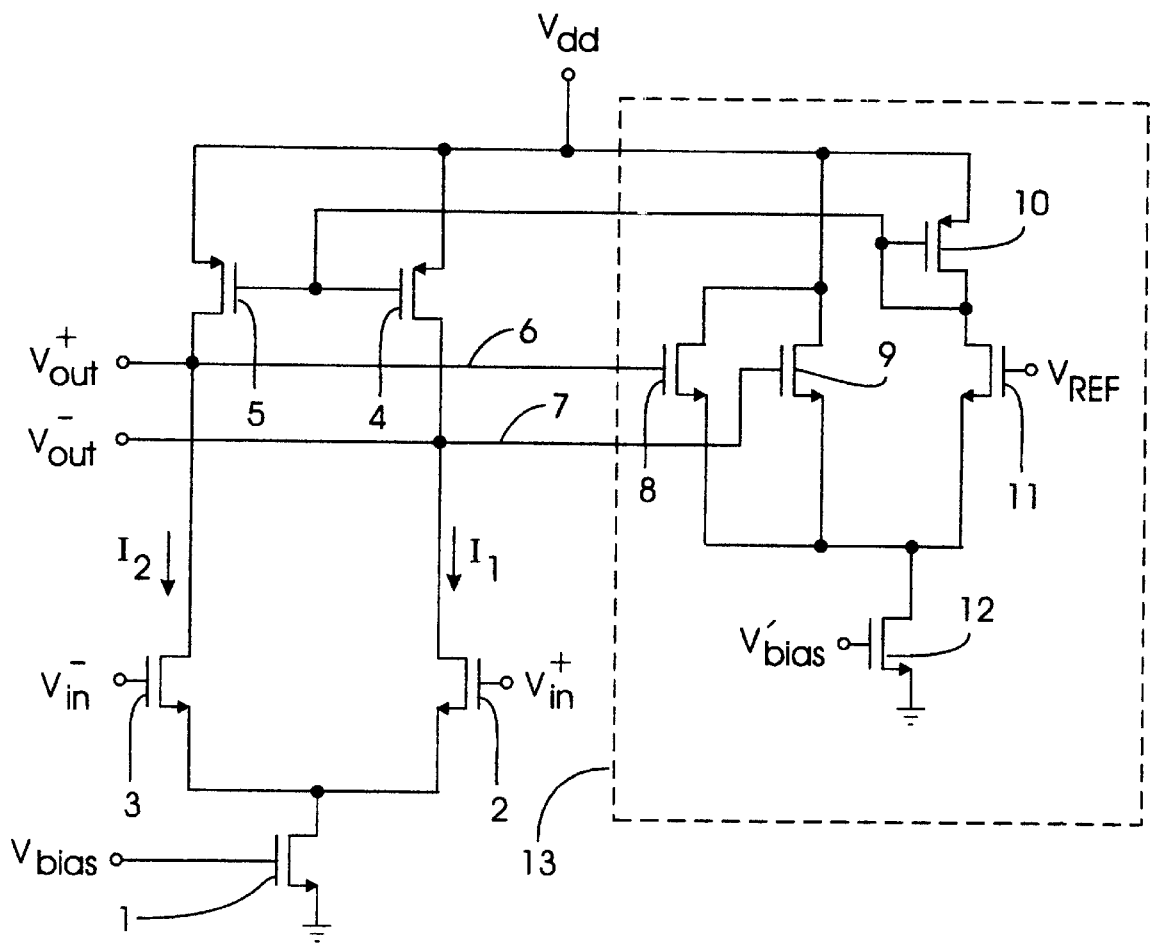
FIG. 1 is a conventional differential operational transconductance amplifier having a pair of NMOS transistors for receiving differential input signals and a feedback circuit to control the common-mode voltage of the OTA outputs.
Figure 3:
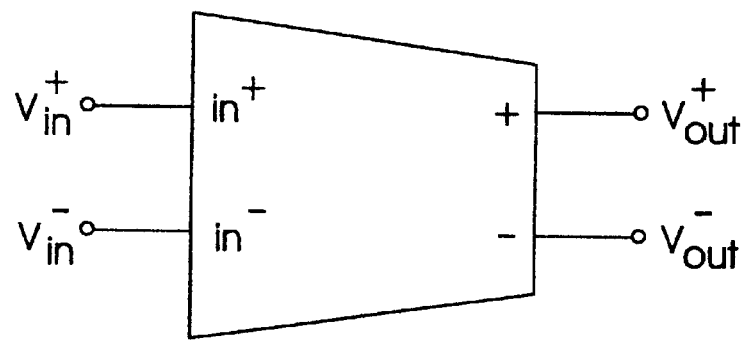
FIG. 3 is a circuit symbol representing the differential OTA of FIG. 1.
Figure 2:
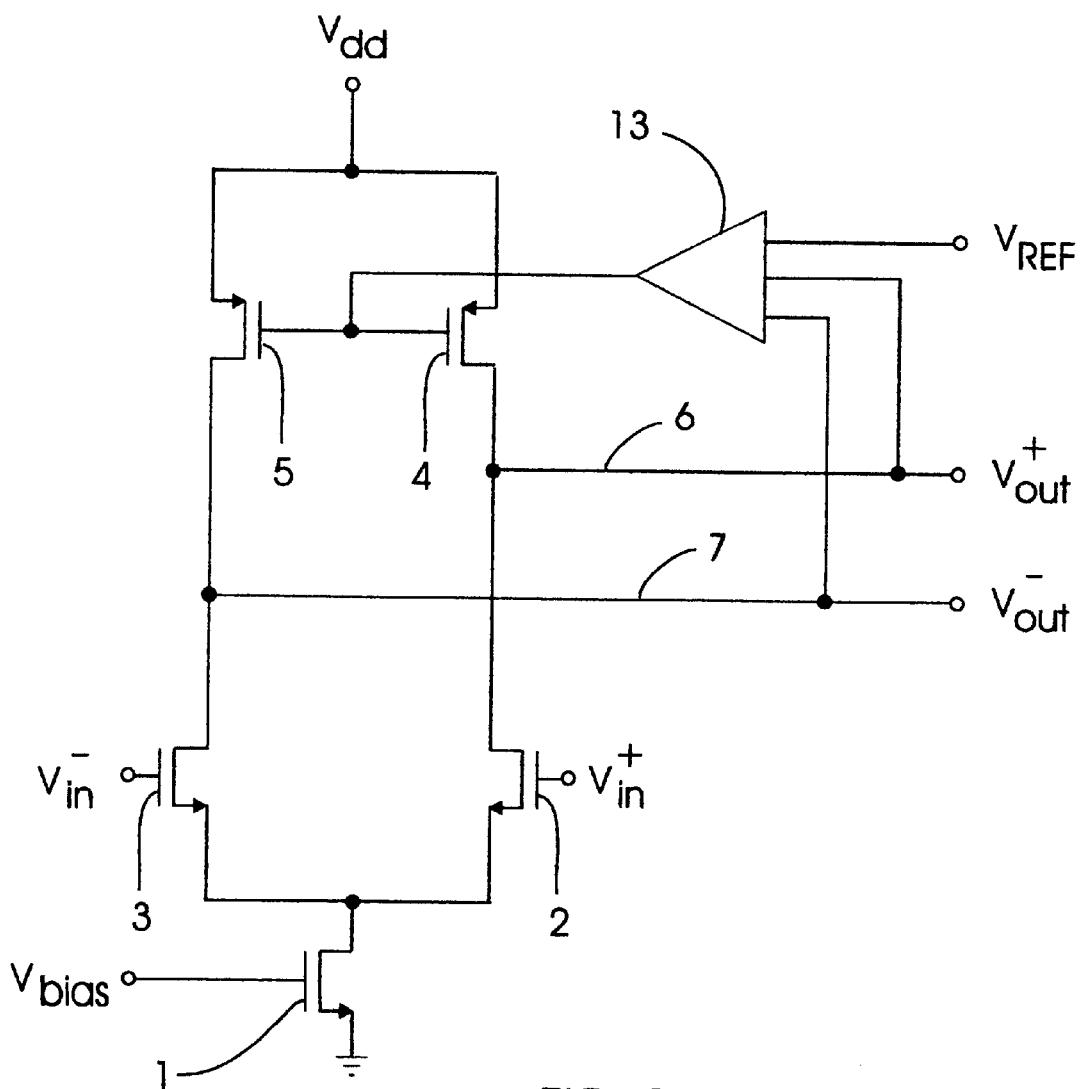
FIG. 2 is a simplified circuit diagram of the differential OTA of FIG. 1, with the OTA's common-mode control circuit 13 being represented by a single component.
Figure 4:
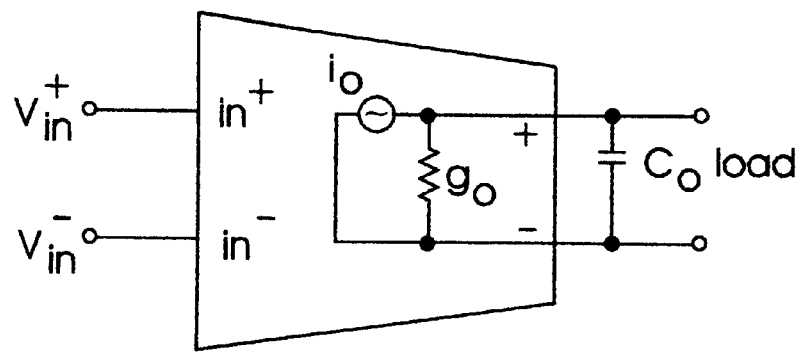
FIG. 4 is a diagram of the equivalent circuit of the differential OTA of FIG. 1, showing the OTA's output conductance and output capacitance.
Figure 5:
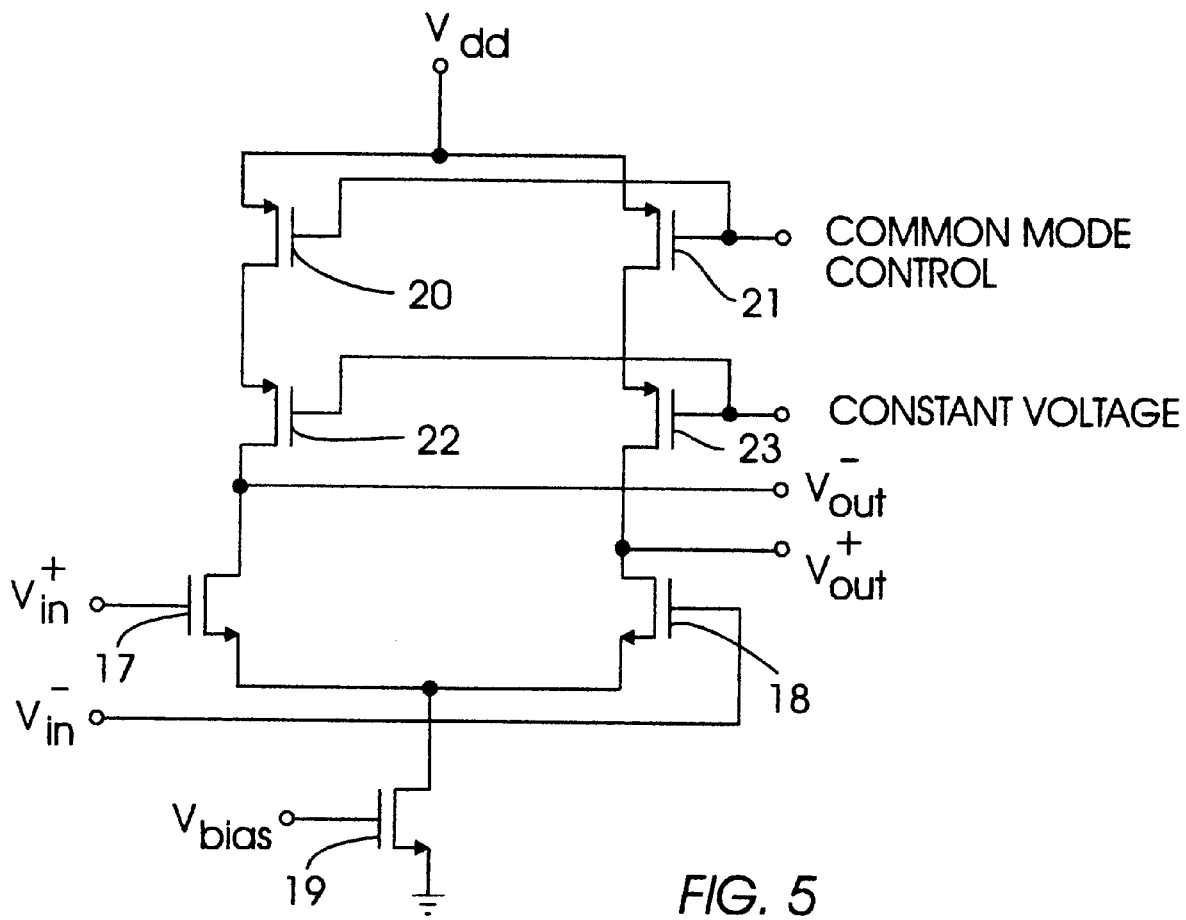
FIG. 5 shows a prior art OTA with an additional PMOS stage for reducing the variation of the OTA's current source, and thus reducing the OTA's output conductance.
Figure 6:
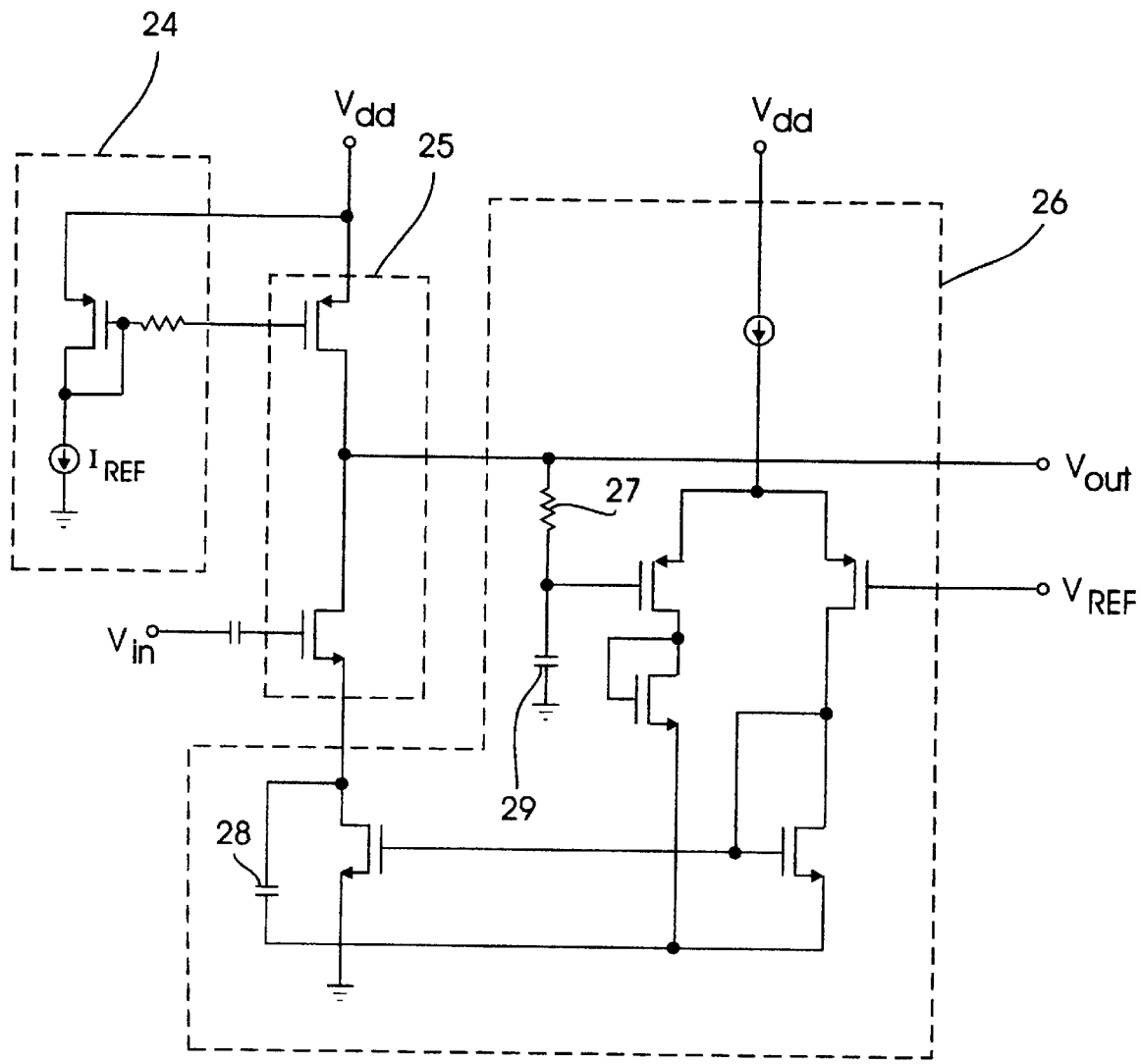
FIG. 6 shows a prior art low-noise amplifier based on the transconductance of its inverters, which includes resistive and capacitive elements for controlling the common-mode voltage of the amplifier output.
Figure 7:
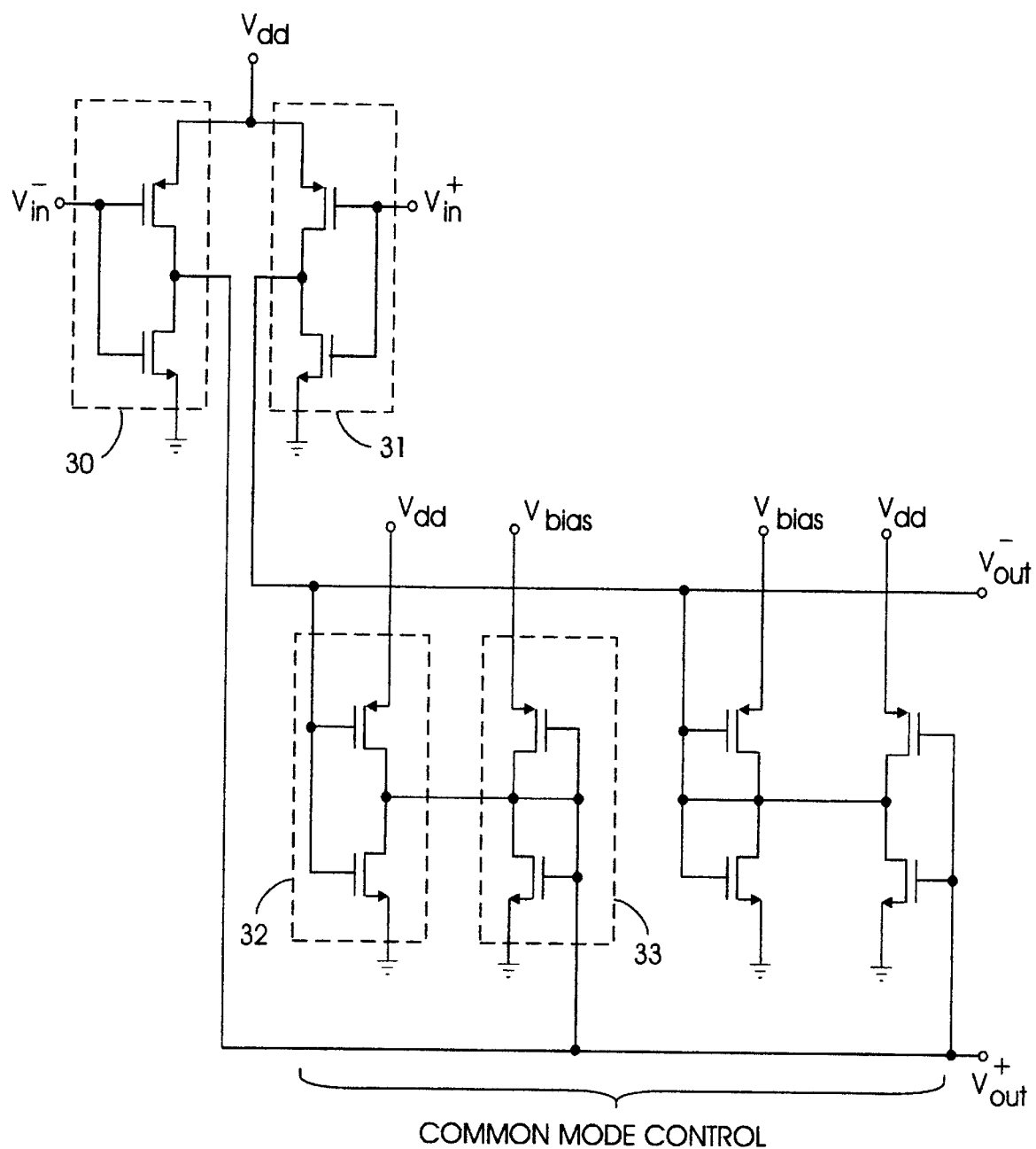
FIG. 7 shows a prior art high-frequency amplifier with a differential transconductance element that is implemented with CMOS inverters.

The current in the negative output 40 of the OTA is given by $V_{in}^+ (g_{mn}+g_{mp})$ where $g_{mn}$ and $g_{mp}$ are the transconductance of the NMOS transistor 42 and PMOS transistor 43, respectively. Since transconductance of the OTA includes that for both the NMOS and PMOS transistors in each input inverter, the OTA of the invention is referred to as a dual-$g_m$ amplifier. Furthermore, in comparison to the prior art OTA shown in FIG. 1, the OTA of FIG. 8 provides an additional transconductance of $g_{mp}$, and therefore a larger output current. Similarly, a larger current is provided in the positive output 41 of the OTA shown in FIG. 8 as compared to that in the OTA output 6 of FIG. 1.

The common-mode control circuit 38 is coupled to the outputs of the inverters 35 and 36, which are also the differential outputs 40 and 41 of the OTA, to provide a feedback loop for controlling the respective DC voltage levels in the outputs of the two inverters. In addition, the Q-control circuit 39 is connected to the OTA's differential outputs 40 and 41 to provide a means for adjusting the output conductance of the OTA. Since the Q-control circuit 39 does not require "transistor stacking", i.e., an additional layer of PMOS transistor for reducing the OTA's output conductance, the OTA of the present invention is more suitable for applications with low-$V_{dd}$ circuits.

Figure 9:
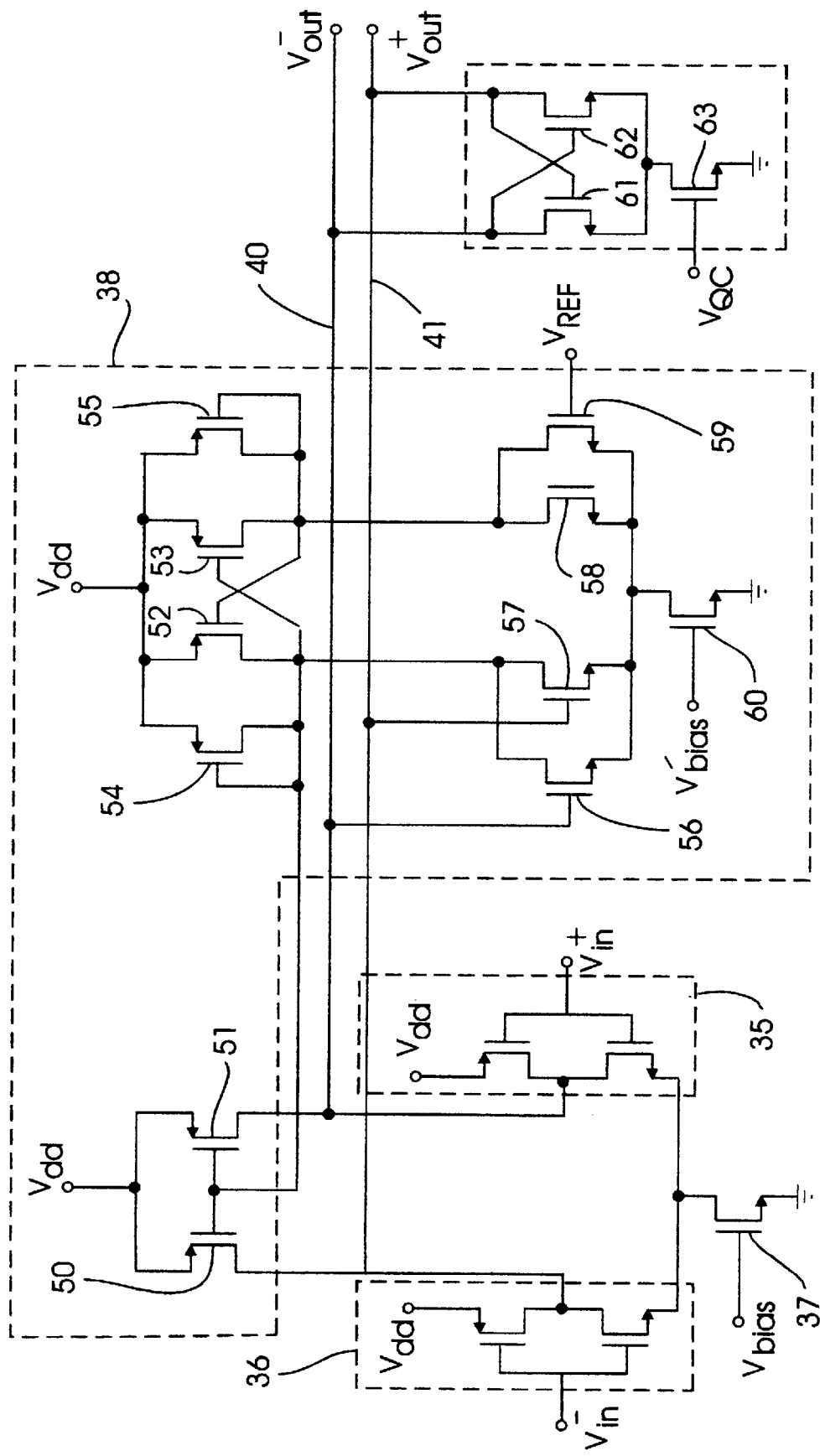
FIG. 9 shows the circuit diagram of the preferred embodiment of the dual-$g_m$ differential OTA of FIG. 8, implemented in CMOS technology.

FIG. 9 shows a detailed circuit diagram for a preferred embodiment of the dual-$g_m$ differential input OTA of FIG. 8, in the CMOS technology. In this preferred embodiment, the common-mode voltage control circuit 38 includes a pair of PMOS transistors 50–51, acting as current sources to the common-mode voltage control circuit 38, and a common-mode feedback loop in the right half of the circuit 38. The main function of the common-mode feedback loop is to control the gates of the current sources (the PMOS transistors 50–51), thus indirectly controlling the common-mode voltage swing of the OTA's outputs. The feedback loop includes a pair of cross-coupled PMOS transistors 52–53 and a pair of diode-connected PMOS transistors 54–55. The transistors 52–55 together make up a high-gain cross-coupled load for the common-mode control circuit 38. In addition, two NMOS transistors 56 and 57 are provided for sensing the differential output signals 40 and 41 of the OTA, while NMOS transistor 60 acts as a current source to the common-mode voltage control circuit 38. The average of the OTA's two differential output signals is compared to a reference voltage signal $V_{REF}$ by NMOS transistors 58 and 59. The NMOS transistor 60 has its source terminal connected to ground and its drain terminal connected to the source terminals of NMOS transistors 56–59. With the cross-coupled arrangement of the PMOS transistors 52 and 53, these transistors provide better sensitivity to common-mode voltage errors, and thus can control the common-mode voltage of the OTA outputs more precisely.

The Q-control circuit 39 preferably includes a pair of NMOS transistors 61 and 62 supplied by a current source 63. Preferably, the current source 63 is an NMOS transistor with its source connected ground, its drain connected to the source terminals of the NMOS transistors 61 and 62 and its gate connected to a control signal $V_{Q-Control}$. The gates and drains of the transistors 61 and 62 are crossed-coupled to each other, as shown in FIG. 8, to improve the Q-factor of the OTA. By adjusting the control signal $V_{Q-Control}$, and therefore the current flowing through the transistor 63, one can maximize the output conductance of the OTA. A target gain and frequency response for the OTA may thus be achieved.

Although the dual-$g_m$ differential input OTA of the invention has been described for receiving a single differential input (input signals $v_{in1}^+$ and $v_{in1}^-$), its circuit may be extended to receive a number of differential inputs by adding additional pairs of input inverters. These additional inverter pairs would be arranged similarly to the inverters 35 and 36, with one inverter pair for each set of differential input signals.

Figure 10:
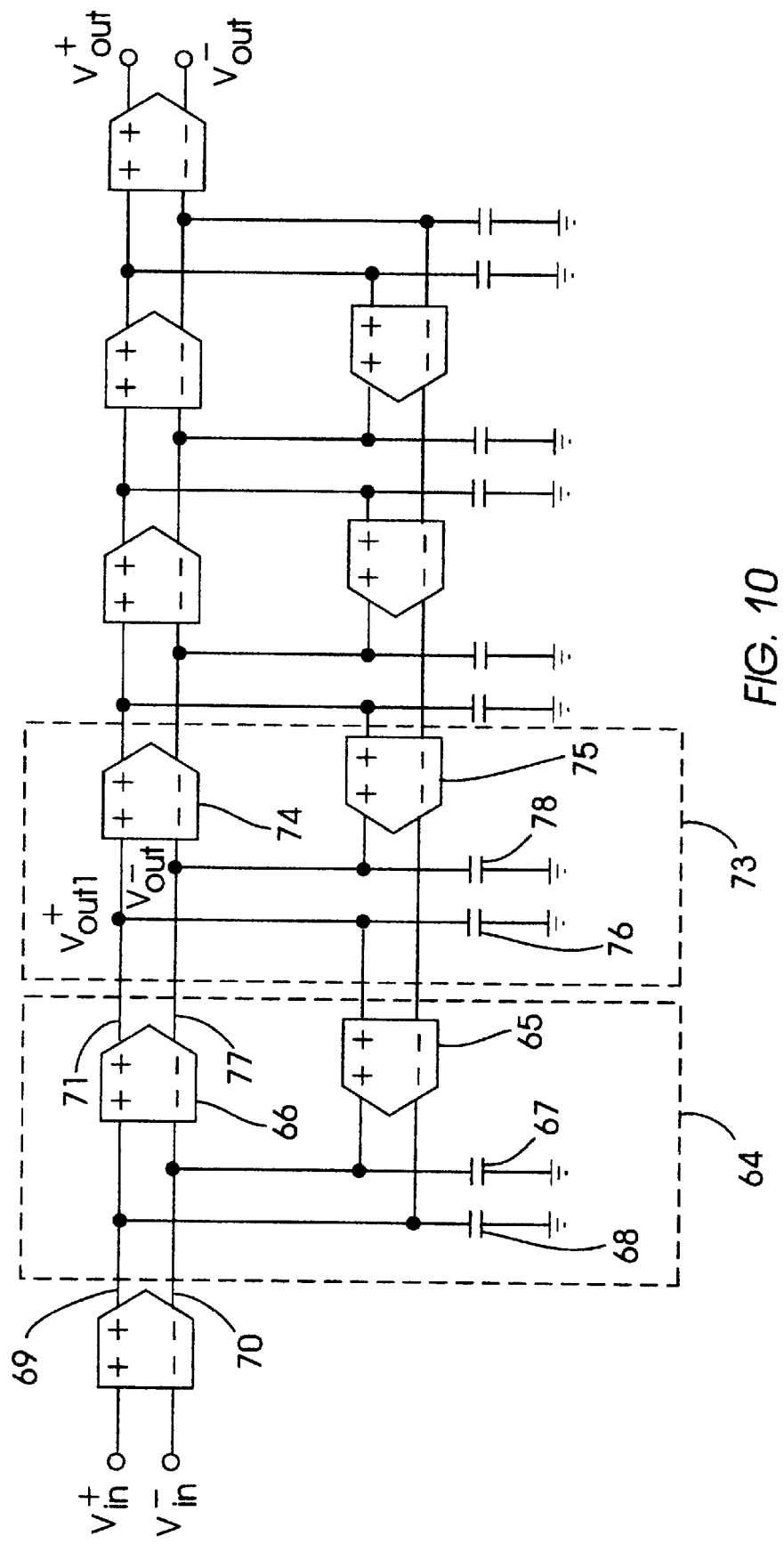
FIG. 10 shows a typical electronically tunable $g_m$C filter utilizing the dual-$g_m$ differential OTA of the invention as a basic building block.

As an application of the dual-$g_m$ differential input OTA of the present invention, several such OTAs might be connected in different configurations to perform specific mathematical manipulations of the input signals. An example of these applications is an electronically tunable filter, such as the electronically tunable $g_m$C filter shown in FIG. 10, in which the dual-$g_m$ differential OTA of the invention is used as a building block. The basic element of a tunable filter is a so-called "integrator", which consists of a capacitor and two OTAs, one OTA for each signal of the differential input. For example, the first integrator 64 of the filter illustrated in FIG. 10 includes dual-$g_m$ differential OTAs 65–66 and capacitors 67–68. The incoming positive input signal 69 to the OTA 66 is converted into a current signal at its output 71. This current then charges the capacitor 76 of the next integrator 73 and produces a voltage signal $v_{out1}^+$ which is proportional to the output conductance of the OTA 66. Similarly, the incoming negative input signal 70 to the OTA 66 is converted into a current signal at its output 77. This current signal then charges the capacitor 78 of the next integrator 73 and produces a voltage signal $v_{out1}^-$. The OTA 65 amplifies the signals coming back from the next integrator 73 and feeds them to the inputs of the OTA 66 as shown by FIG. 10. Recall from the description of the Q-control circuit 39 above that the output conductance of an OTA can be controlled by adjusting the control signal $V_{Q-Control}$ for that OTA. Thus, by manipulating the $V_{Q-Control}$ signals of the dual-$g_m$ differential OTAs in each integrator, selected levels of the voltages $v_{out-i}^+$ and $v_{out-i}^-$ from an integrator i can be generated to charge the capacitors of the next integrator i+1.

Figure 11:
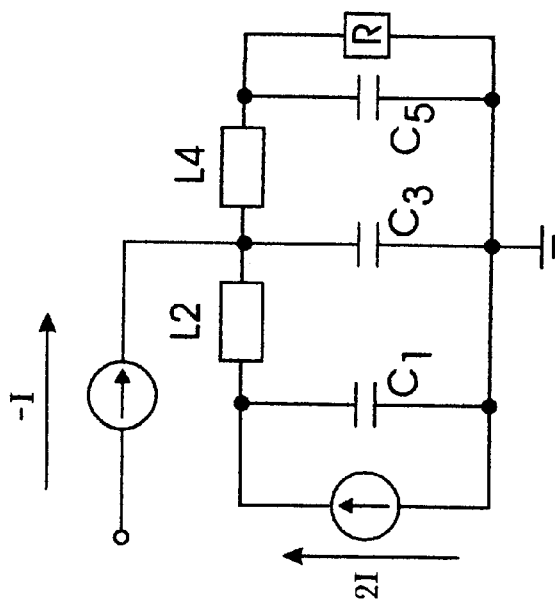
FIG. 11 is a simplified L-C network representing the electronically tunable $g_m$C filter of FIG. 10.

Many such integrators 64 may be connected together to simulate an L-C (inductor-capacitor) network of a filter, such as the L-C network of FIG. 11. Since the transconductance of any OTA is dependent of its operating current (generated by the current sources 37 and 63, FIG. 9), the cut-off frequency characteristics of the filter will be tunable by adjusting the operation currents of its OTAs. The maximum cut-off frequency of the such a filter is inversely proportional to the transconductance of the OTAs. Accordingly, to extend the cut-off frequency of the filter, one only needs to increase the transconductance of the OTA.

Figure 12:
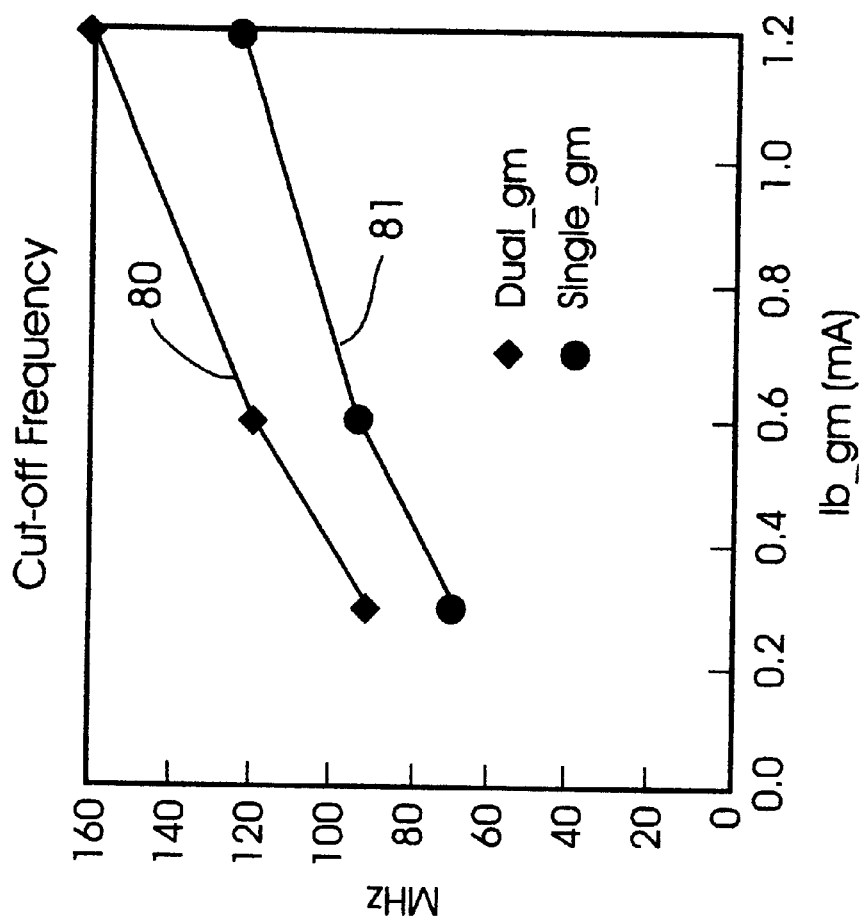
FIG. 12 is a graph comparing the frequency characteristics of an example low-pass filter made from conventional OTAs against a filter that uses the dual-$g_m$ differential OTAs of the invention.

Finally, FIG. 12 is a graph illustrating the performance advantages of the dual-$g_m$ differential OTA of the invention in comparison to a conventional OTA. The cut-off frequency characteristics of a low-pass filter made of the conventional OTA is first plotted against its operating current as curve 80. The frequency characteristics of the same filter made from the dual-$g_m$ differential OTA of the invention is represented by curve 81. As can be seen from the graph, the operating current of the example low-pass filter can be reduced by approximately 50% when the dual-$g_m$ differential OTA of the invention is used. In other words, the filter operates at the same bandwidth with half the normal power or doubles its bandwidth using the same power.

While a preferred embodiment of the invention has been described, it should be apparent that modifications and adaptations to this embodiment may occur to persons skilled in the art without departing from the scope and the spirit of the present invention as set forth in the following claims.

What is claimed is:

1. A differential operational transconductance amplifier (OTA) for amplifying a differential input having positive and negative input signals, the OTA having positive and negative outputs and an output conductance, comprising:

a pair of inverters for respectively receiving the positive and negative input signals, the output of each inverter having a DC voltage level and coupled to a respective OTA output;

a common-mode voltage control circuit coupled to the output of each inverter for controlling the DC voltage level of the inverter; and a Q-control circuit coupled to the outputs of the inverters for adjusting the output conductance of the OTA.

2. The OTA as recited in claim 1, wherein the common-mode voltage control circuit includes:

a pair of compensating current sources coupled respectively to the OTA outputs; and a high-gain amplifier connected between the inverters and the compensating current sources.

3. The OTA as recited in claim 2, wherein the compensating current sources are PMOS transistors.

4. The OTA as recited in claim 2, wherein the high-gain amplifier includes a pair of comparators for comparing the respective DC voltage levels of the inverter outputs to a reference voltage, the outputs of the comparators being coupled respectively to the compensating current sources.

5. The OTA as recited in claim 4, wherein:

the high-gain amplifier includes a cross-coupled PMOS transistor load connected to the comparators; and each comparator includes a pair of first and second NMOS transistors each having a source coupled to a bias current source, a drain coupled to the PMOS transistor load, and a gate, the gates of the first NMOS transistors being connected respectively to the OTA outputs, and the gates of the second NMOS transistors being connected the reference voltage.

6. The OTA as recited in claim 5, wherein the transistor load includes, for each comparator, a pair of first and second PMOS transistors each having a source coupled to a supply voltage $V_{dd}$, a drain, and a gate, the drains and gates of the first PMOS transistors being cross-coupled to each other, and the drains and gates of the second transistors being diode-coupled to each other.

7. The OTA as recited in claim 1, wherein the Q-control circuit includes:

a current source; and a pair of NMOS transistors each having a source, a drain, and a gate, the drain and gate of one NMOS transistor being cross-coupled to the gate and drain of the other NMOS transistor, respectively, the sources of the NMOS transistors being coupled to the current source, and the drains of the transistors being coupled respectively to the OTA outputs.

8. The OTA as recited in claim 7, wherein the current source is a third NMOS transistor having a source coupled to ground, a drain coupled to the sources of the first and second NMOS transistors, and a gate coupled to a voltage $V_{QC}$ for adjusting the current source.

9. An electronically tunable filter comprising a plurality of integrators connected in series, each integrator including first and second differential operational transconductance amplifiers (OTAs) and first and second capacitors, each OTA having positive and negative inputs and outputs, for each integrator, the positive and negative outputs of the first OTA being connected respectively to the positive and negative inputs of the first OTA of the next integrator, the positive and negative inputs of the first OTA being connected to the negative and positive outputs of the second OTA and to the first and second capacitors, respectively, each OTA having an output conductance and comprising:

a pair of inverters for receiving the positive and negative inputs of the OTA, the output of each inverter having a DC voltage level and coupled to a respective OTA output;

a common-mode voltage control circuit coupled to the output of each inverter for controlling the DC voltage level of the inverter; and a Q-control circuit coupled to the outputs of the inverters for adjusting the output conductance of the OTA.

10. The filter as recited in claim 9, wherein the common-mode voltage control circuit includes:

a pair of compensating current sources coupled respectively to the OTA outputs; and a high-gain amplifier connected between the inverters and the compensating current sources.

11. The filter as recited in claim 10, wherein the compensating current sources are PMOS transistors.

12. The filter as recited in claim 10, wherein the high-gain amplifier includes a pair of comparators for comparing the respective DC voltage levels of the inverter outputs to a reference voltage, the outputs of the comparators being coupled respectively to the compensating current sources.

13. The filter as recited in claim 12, wherein:

the high-gain amplifier includes a cross-coupled PMOS transistor load connected to the comparators; and each comparator includes a pair of first and second NMOS transistors each having a source coupled to a bias current source, a drain coupled to the PMOS transistor load, and a gate, the gates of the first NMOS transistors being connected respectively to the OTA outputs, and the gates of the second NMOS transistors being connected the reference voltage.

14. The filter as recited in claim 13, wherein the transistor load includes, for each comparator, a pair of first and second PMOS transistors each having a source coupled to a supply voltage $V_{dd}$, a drain, and a gate, the drains and gates of the first PMOS transistors being cross-coupled to each other, and the drains and gates of the second transistors being diode-coupled to each other.

15. The filter as recited in claim 9, wherein the Q-control circuit includes:

a current source; and a pair of NMOS transistors each having a source, a drain, and a gate, the drain and gate of one NMOS transistor being cross-coupled to the gate and drain of the other NMOS transistor, respectively, the sources of the NMOS transistors being coupled to the current source, and the drains of the transistors being coupled respectively to the OTA outputs.

16. The filter as recited in claim 15, wherein the current source is a third NMOS transistor having a source coupled to ground, a drain coupled to the sources of the first and second NMOS transistors, and a gate coupled to a voltage $V_{QC}$ for adjusting the current source.

* * * * *